(12) United States Patent
Juskey et al.

(10) Patent No.: US 8,680,683 B1
(45) Date of Patent: Mar. 25, 2014

(54) WAFER LEVEL PACKAGE WITH EMBEDDED PASSIVE COMPONENTS AND METHOD OF MANUFACTURING

(75) Inventors: Frank J. Juskey, Apopka, FL (US); Robert C. Hartmann, Apopka, FL (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 4 days.

(21) Appl. No.: 12/957,004

(22) Filed: Nov. 30, 2010

(51) Int. Cl.
*H01L 23/48* (2006.01)
*H01L 23/52* (2006.01)
*H01L 23/28* (2006.01)
*H01L 23/29* (2006.01)
*H01L 29/40* (2006.01)

(52) U.S. Cl.
USPC ........... 257/774; 257/690; 257/787; 257/790; 257/781

(58) Field of Classification Search
USPC ......... 257/774, 790, 787, 686, 690, 778, 779, 257/780, 781, 784
See application file for complete search history.

(56) References Cited

U.S. PATENT DOCUMENTS

| | | | |
|---|---|---|---|
| 6,063,646 A | 5/2000 | Okuno et al. | |
| 6,271,469 B1 | 8/2001 | Ma et al. | |
| 6,531,767 B2 | 3/2003 | Shrauger | |
| 6,900,459 B2 | 5/2005 | Farnworth et al. | |
| 6,991,966 B2 * | 1/2006 | Tuominen | 438/118 |
| 6,998,710 B2 | 2/2006 | Kobayashi et al. | |
| 7,023,085 B2 | 4/2006 | Pu | |
| 7,183,191 B2 | 2/2007 | Kinsman et al. | |
| 7,202,107 B2 | 4/2007 | Fuergut | |
| 7,294,529 B2 | 11/2007 | Tuominen | |
| 7,456,496 B2 | 11/2008 | Hwee et al. | |
| 7,514,297 B2 | 4/2009 | Wallace | |
| 7,741,148 B1 | 6/2010 | Marimuthu et al. | |
| 7,772,115 B2 | 8/2010 | Hiatt | |
| 7,772,116 B2 | 8/2010 | Akram et al. | |
| 7,776,655 B2 | 8/2010 | Do et al. | |
| 7,799,602 B2 | 9/2010 | Pagaila et al. | |
| 7,811,920 B2 | 10/2010 | Matsui | |
| 7,835,157 B2 | 11/2010 | Tilmans et al. | |
| 2002/0043402 A1 | 4/2002 | Juskey et al. | |
| 2006/0049530 A1* | 3/2006 | Hsu | 257/784 |
| 2006/0231937 A1 | 10/2006 | Juskey et al. | |
| 2008/0036034 A1 | 2/2008 | Juskey et al. | |

(Continued)

OTHER PUBLICATIONS

Beth Keser, Ph.D., RCP Technology Mgr.; "Redistributed Chip Package (RCP) Technology"; MEPTEC; Nov. 14, 2006.

(Continued)

*Primary Examiner* — Chuong A. Luu
(74) *Attorney, Agent, or Firm* — Schwabe Williamson & Wyatt

(57) ABSTRACT

A wafer level package includes an epoxy layer formed on an adhesive covered substrate during manufacturing for securing electrical components in place prior to being embedded in a molded material. An electrically conductive block is fixed in the epoxy layer. Vias are formed for accessing face up component contacts using a metalized layer on the surface of the molded material. After stripping the adhesive and substrate, the epoxy layer is penetrated to expose electrical contacts for face down components. An electrical connection is made between the face up and face down components using the block. Optionally, a dielectric layer covers the molded material and a second metalized layer placed on the dielectric layer to carry another electrical component embedded in a second dielectric layer covering the first dielectric layer. Thus a stacked component arrangement including multiple die and passive components is effectively fabricated into the wafer level package.

11 Claims, 12 Drawing Sheets

(56) References Cited

U.S. PATENT DOCUMENTS

| | | |
|---|---|---|
| 2008/0088004 A1 | 4/2008 | Yang et al. |
| 2008/0157897 A1* | 7/2008 | Tilmans et al. ............... 333/105 |
| 2009/0166840 A1 | 7/2009 | Kang et al. |
| 2011/0045642 A1* | 2/2011 | Hizume et al. ................ 438/126 |
| 2011/0084382 A1* | 4/2011 | Chen et al. .................... 257/737 |

OTHER PUBLICATIONS

Keser, Beth; The Redistributed Chip Package: A Breakthrough for Advanced Packaging; Freescale Semiconductor; Electronic Components and Technology Conference; 2007.

* cited by examiner

WAFER LEVEL PACKAGE WITH EMBEDDED PASSIVE COMPONENTS AND METHOD OF MANUFACTURING

FIELD OF THE INVENTION

The present invention generally relates to wafer leveling packaging and in particular to packaging of an active semiconductor or acoustical component with a passive component operable therewith.

BACKGROUND OF THE INVENTION

Wafer level packaging (WLP) generally refers to the technology of packaging an integrated circuit at wafer level, instead of the traditional process of assembling the package of each individual unit after wafer dicing. WLP is essentially a chip-scale packaging (CSP) technology, since the resulting package is practically of the same size as the die. It is appreciated by those of ordinary skill in the art that wafer-level packaging has paved the way for integration of wafer fabrication, packaging, test, and burn-in at wafer level, for streamlining the manufacturing process.

Wafer level packaging extends the wafer fabrication processes to include device interconnection and device protection processes. As currently understood in the art, there are WLP technology classifications that may be defined as redistribution layer and bump technology, encapsulated copper post technology, encapsulated wire bond technology, and encapsulated beam lead technology.

Redistribution layer and bump technology extends the conventional wafer fabrication process with an additional step that deposits a multi-layer thin-film metal rerouting and interconnection system to each device on the wafer. This is achieved using standard photolithography and thin film deposition techniques employed in the device fabrication. This additional level of interconnection redistributes the peripheral bonding pads of each chip to an area array of metal pads that are evenly deployed over the chip's surface. The solder balls or bumps used in connecting the device to the application circuit board are subsequently placed over these pads. Aside from providing external connections for the WLP, the redistribution technique improves reliability by allowing the use of larger and more robust balls for interconnections.

As further presented in a paper by Michael Topper for Future Fab International, a project from MazikMedia, Inc., within a decade wafer level packaging has changed the infrastructure in the semiconductor industry. Integrated passives, 3-D integration and MEMS/MOEMS have adopted the reliable WLP concepts. 3-D integrated systems need less board space in conjunction with reduced interconnection length providing less parasitic effects for high frequency applications. Integrated passive components will further push the WLP processing. The industry wide adoption of WLP will benefit from the flip chip and wafer bumping infrastructure which is currently created at a breathtaking pace, because process technology, process equipment and materials and general modes of thinking bear many similarities. WLP has to change into a complex system integration to face the rapid developments in semiconductors and to satisfy the increasing functionality demanded by consumers.

In addition, well known manufacturing methods include redistributed chip packaging (RCP) which eliminates the need for wire bonds, package substrates, and flip chip bumps, by way of example. Such is desirable for packaging highly miniaturized devices. RCP provides an interconnect buildup technology in which the package is a functional part of a die. In addition, RCP does not utilize blind vias or require thinned die to achieve thin profiles. Such features simplify assembly, lower costs, and provide compatibility with advanced wafer manufacturing processes utilizing low-k interlayer dielectrics. RCP offers advantages in speed, power, and manufacturability that help enable manufacturers to create small, sleek multifunction devices. A desirable reduction in die area saves board space, and a reduction in thickness reduces the board profile. A reduction in materials and processing costs results from the elimination of wire bond and flip chip bump interconnect technologies. There is a reduction in wafer processing and package yield loss due to thin die handling. Die compatible materials that minimize stress and thermal mismatches, while improving reliability and minimizing defects.

Based on current trends and industry demand, it is desirable for the next generation of wafer level packages or modules to be cheaper and smaller for use in future cell phones, by way of example. It is further desirable that their manufacturing process provides greater functionality with improved yields. The present invention is directed to improving the wafer level package and its manufacturing.

SUMMARY OF THE INVENTION

In view of the foregoing background, the present invention is directed to wafer level modules or packages that may include passive components and semiconductor die embedded into a laminated circuit carrying portion of the module and methods of manufacturing that eliminate problems encountered with passive component movement during the molded process of small light weight parts.

Manufacturing process embodiments of the invention employ compression molded in conjunction with pillar bumping. Using such compression molded methods, relatively large areas can be molded that cannot be done with conventional transfer molding. Back grinding the mold compound to expose the pillars in effect renders them the same as a plated through hole in a PCB. This exposed metal tip can then be connected to other pillars and to external components by using conventional printed circuit board (PCB) circuit application techniques while embedding the passive elements within the laminate, while not disturbing the active devices.

One approach called redistributed chip package (RCP) approaches the technology by placing a standard die face down, molding, then turning the molded parts face up and using conventional MCM-D technology of BCB and thin film interconnecting the die to other components and the external world. This takes advantage of our pillar bumping technology and enhances it by allowing us to add the passives to different levels of the devices improving both yield and electrical performance. This technology will allow greater integration of components than within current modules and will obsolete conventional technology within the next 2-3 years for most of the new cell phone applications.

During the manufacturing of wafer level fan out (WLFO) modules, the problem of excessive movement of passives was noted. One approach to solving such a problem includes using extremely low viscosity mold compounds. However, an improved solution, as will herein be described, includes fixing components in an epoxy layer prior to embedding them in a molding material.

One wafer level package based on the teachings of the present invention may comprise an epoxy layer having a plurality of electrical components fixed into the epoxy layer at preselected locations. The plurality of electrical components is embedded in a molded material. A plurality of vias within the molded material provides access to preselected electrical contacts for at least a portion of the plurality of electrical components. A metalized layer on the surface of the molding material connects the electrical contacts through accessing the vias.

Another embodiment according to the teachings of the present invention may comprise a wafer level package having first component having electrical contacts on at least a first side thereof and a second component having electrical contacts are on a first side thereof, the first and second components carried in an opposing face up and face down orientation. The package may comprise an electrically conductive block. A molded material substantially encompasses the components and the block, wherein the face down component and one side of the block are exposed. A plurality of vias within the molded material exposes preselected electrical contacts from the first component and an opposing side to the one side of the conductive block. Metalized layers on the exposed surfaces of the molding material are sufficient for connecting the electrical contacts to the conductive block. The metalized layers electrically connect the first component to the second component through the conductive block.

Another wafer level module or package resulting from the teachings of the present invention may comprise an epoxy layer with a first component fixed into the epoxy layer, wherein electrical contacts are on a first side thereof and an opposing second side thereof is fixed into the epoxy layer, and a second component fixed into the epoxy layer, wherein electrical contacts are on a first side thereof and the first side is fixed into the epoxy layer. An electrically conductive block may also be fixed into the epoxy layer. A molded material encompasses the components and the block with a plurality of first vias formed within the molded material for accessing preselected electrical contacts from the first component and for exposing the conductive block. A metalized layer on the surface of the molding material may connect preselected electrical contacts to the conductive block. A plurality of second vias may be formed within the epoxy from an exposed surface thereof for accessing preselected electrical contacts from the second component and for exposing the conductive block. Thus, an electrical connection between the second component and the block may be made electrically connecting the first and second components.

Yet further, a semiconductor package may comprise a plurality of first electrical components embedded within a molded material and fixed at preselected locations therein, and at least one first via extending into the molded material from a first surface thereof for accessing preselected electrical contacts of at least a portion of the plurality of first electrical components. A first metalized layer on the first surface of the molding material may selectively connect the electrical contacts through the at least one first via. A first dielectric layer covers the molded material and the first metalized layer and at least one second via extends into the first dielectric layer for providing access to preselected locations of the first metalized layer. A second metalized layer on a surface of the first dielectric layer selectively connects the first metallization layer through the at least one second via, and at least one second electrical component on a surface of the first dielectric and electrically connected to the second metalized layer. A second dielectric layer covers the at least one second electrical component and the second metalized layer, and at least one third via extending into the second dielectric layer for providing access to at least one second electrical component. A third metalized layer on a surface of the second dielectric layer selectively connects electrical contacts of the at least one second electrical component through the at least one third via.

A method aspect of the invention comprises providing a carrier substrate having fiducial marks, applying an adhesive layer onto a surface of the carrier substrate and applying an epoxy layer onto the adhesive layer, placing a first component into the epoxy layer, wherein electrical contacts are on a first side thereof and an opposing second side thereof is fixed into the epoxy layer, and wherein locations of the electrical contacts are identifiable from the fiducial marks, placing a second component into the epoxy layer, wherein electrical contacts are on a first side thereof and the first side is fixed into the epoxy layer, and wherein locations of the electrical contacts are identifiable from the fiducial marks, and placing an electrically conductive block into the epoxy layer. The epoxy layer is then cured. The components and the block are then embedded in a molded material. A portion of the molded material is removed from an exposed surface thereof as guided by the fiducial marks for exposing preselected electrical contacts from the first component and for exposing the conductive block. A metalized layer is formed on the surface of the molding material sufficient for connecting the electrical contacts to the conductive block. The carrier substrate and the adhesive are then stripped from the epoxy and exposing a surface of the cured epoxy. A portion of the epoxy layer is removed from the exposed surface for exposing preselected electrical contacts from the second component and the conductive block, and the second component is electrically connected to the block, thus providing an electrical connection between the first and second components.

Another method aspect of the invention comprises providing a carrier substrate, applying an adhesive layer onto a surface of the carrier substrate, and applying an epoxy layer onto the adhesive layer. A plurality of components is placed into the epoxy layer at preselected locations and the epoxy cured. The plurality of electrical components are then embedded in a molded material and a portion of the molded material removed from a surface thereof for exposing preselected electrical contacts for at least a portion of the plurality of electrical components. A metalized layer is formed on the surface of the molding material sufficient for connecting the electrical contacts. The carrier substrate and adhesive are then separated from the epoxy for providing the semiconductor package.

One other method aspect of the invention may comprise applying an adhesive layer onto a surface of a carrier substrate and placing a first component onto the adhesive layer, wherein electrical contacts are on at least a first side thereof and facing upward from the adhesive layer, an opposing second side thereof fixed to the adhesive layer. A second component is placed onto the adhesive layer, wherein electrical contacts are on a side thereof and facing downward and fixed onto the adhesive layer. In addition, an electrically conductive block is also placed onto the adhesive layer. The components and the block are embedded in a molded material. A portion of the molded material is removed from a first exposed surface thereof for exposing preselected electrical contacts from the first component and the conductive block. A metalized layer is formed on the exposed surface of the molding material sufficient for connecting the electrical contacts to the conductive block. The carrier substrate and the adhesive are stripped, thus exposing the electrical contacts of the second component and the electrically conductive block. The second component is electrically connected to the conductive block for providing an electrical connection between the first and second components.

Yet another method aspect of the invention may comprise a method of producing a semiconductor package including the steps of providing a carrier substrate having fiducial marks associated therewith and applying an adhesive layer onto a surface of the carrier substrate. First and second electrical components are placed onto the adhesive layer, wherein electrical contacts are on a first side thereof and an opposing second side thereof is removably affixed to the adhesive layer, and wherein locations of the electrical contacts are identifiable from the fiducial marks. The components are then embedded in a molded material and a portion of the molded material removed from an exposed surface thereof as guided by the fiducial marks for exposing preselected electrical contacts from the first and second component. A first metalized layer is formed on the surface of the molding material for connecting the electrical contacts. A first dielectric layer is then formed onto the molded material and a portion removed for exposing preselected locations of the first metalized layer. A second metalized layer is then formed on a surface of the first dielectric layer for connecting the portions of the second metalized layer to portions of the first metalized layer. Third or other electrical components are placed into electrical contact with the second metalized layer. A second dielectric layer is formed onto the first dielectric layer sufficient for covering the second metalized layer and the third electrical component. Alternatively, the second dielectric layer may be formed and then a portion renamed for receiving the third component. A portion of the second dielectric layer is removed as guided by the fiducial marks for exposing an electrical contact of the third component. A third metalized layer is then formed on a surface of the second dielectric layer for electrical connection to the third electrical component, and carrier substrate and the adhesive stripped from the molded material.

Embodiments of the invention include use of a pillar bumped die and placing the die face up instead of face down. This in conjunction with using conventional PCB techniques rather than the more expensive thin film and redistribution techniques of MCM-D makes this a desirable process.

BRIEF DESCRIPTION OF THE DRAWINGS

For a fuller understanding of the invention, reference is made to the following detailed description, taken in connection with the accompanying drawings illustrating various embodiments of the present invention, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
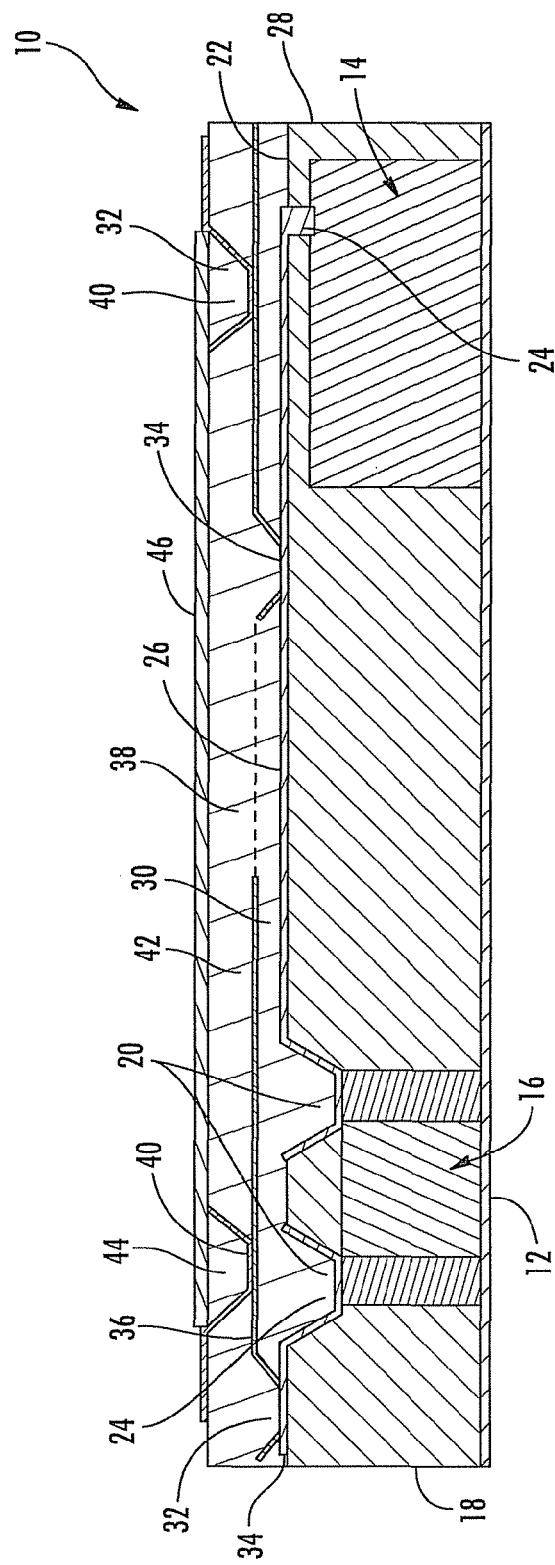
FIG. 1-3 are diagrammatical cross sections views of discrete wafer level semiconductor packages according to the teachings of the present invention.

As illustrated initially by way of example with reference to FIG. 1, one embodiment of the invention comprises a semiconductor, wafer level, package 10 comprising an epoxy layer 12 and two electrical components, herein described as a semiconductor die 14 and a passive component 16, such as a resistor or capacitor, both of which are fixed into the epoxy layer at preselected locations within the package. The components 14, 16 are embedded in a molded material 18, within which vias 20 are formed from a surface 22 of the molded material for accessing preselected electrical contacts 24 for the electrical components. A first metalized layer (traces) 26 on the surface of the molded material 18 connects the electrical contacts 24 through accessing the vias 20. The molded material 18 may be ground down during the manufacturing process for accessing a pillar 28 of the die 16. Alternatively, the package 10 may have a coating in place of or in addition to the epoxy layer 12.

With continued reference to FIG. 1, the package 10 includes may further include a first dielectric layer 30 covering the molded material 18 and the first metallization layer 26. Second vias 32 provide access to preselected locations of the metallization layer 26, as desired. A second metallization layer 36 on a surface 38 of the first dielectric layer 30 connects portions 40 of the second metallization layer 36 to portions of the first metallization layer 26. Yet further, a second dielectric layer 42 may cover the first dielectric layer 30 and the second metallization layer 36, as desired. An access via 44 is provided for contacting the second metallization layer 36. As will be known to those of skill in the art, the finished package 10 may include a solder mask 46 for providing electrical connection to the package components 14, 16.

Figure 2:
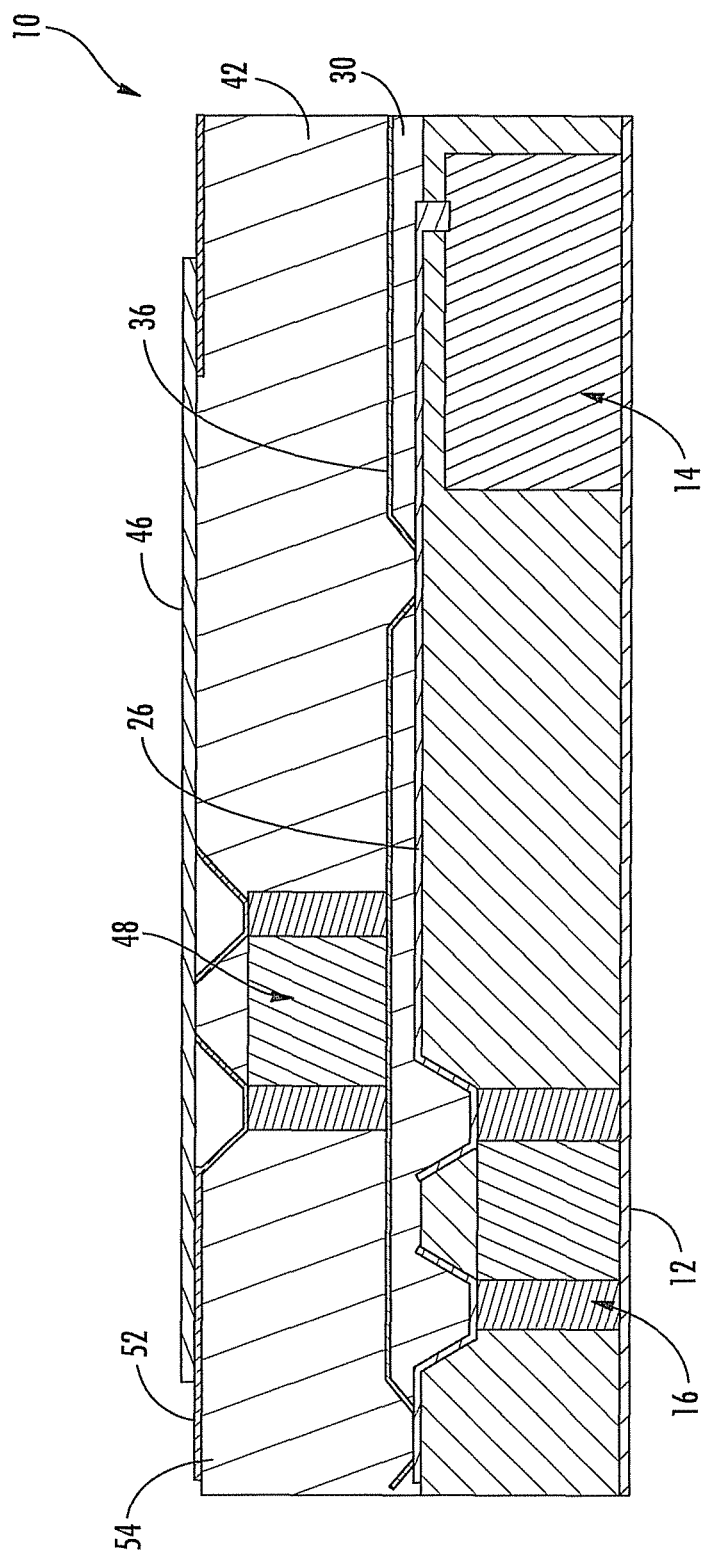

With continued reference to FIG. 1 and now to FIG. 2, the present invention allows the package 10 to be expanded to include yet other components, such as a second passive component 48, herein described by way of example, to be fixed within the second dielectric layer 42, on the surface 38 of the first dielectric layer 30 and electrically connected to the second metalized layer 36, as desired. The second dielectric layer 42 is dimensioned to cover the second passive component 48 and the second metalized layer 36, as illustrated. Third vias 50 extend into the second dielectric layer 42 for providing access to the second passive component 48. As desired, a third metalized layer 50 may be placed on a surface 54 of the second dielectric layer 42 selectively connecting electrical contacts of the second passive component 48 using the third vias 50. The solder mask 46 may again be provided for connection to the package components 14, 16, 48 via the metallization layers 26, 36, 52 as desired and as will come to the mind of those skilled in the art now having the benefit of the teachings of the present invention.

Figure 3:
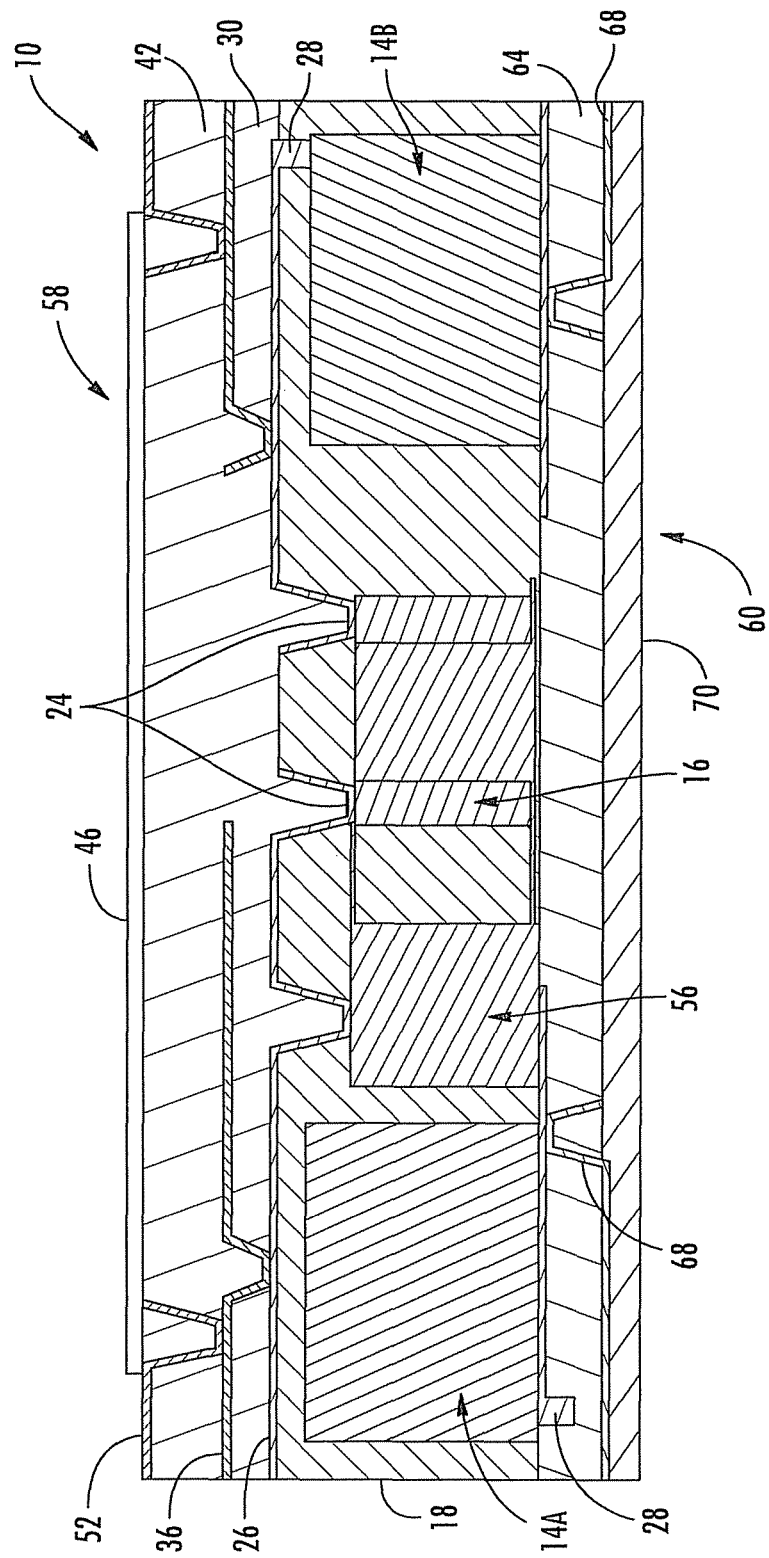

Yet further, various placements of the components 14, 16 may be made including use of an electrically conductive block 56 for accessing opposing sides, top side 58, bottom side 60, of the package 10 as illustrated with reference to FIG. 3. As illustrated, the molded material 18 substantially encompasses the components 14, 16 and the block 56. As herein described by way of example, a first die 14A may be placed face down and a second die 14B is placed face up within the package 10. As above described, vias within the molded material expose preselected electrical contacts of the components. A fourth metallization layer 66 is placed on the bottom surface 62 of the molded material 18 for connecting preselected electrical contacts to the conductive block 56, the metalized layer 26 electrically connecting the face up die 14B to the passive component 16 and/or the face down die 14A through the conductive block 56, as desired. A third dielectric layer 64 is on the bottom side 60 and covers the fourth metallization layer 66, with a fifth metallization layer 68 provided for electrically accessing the components 14, 16 as desired. The bottom side 60 of the package 10 may further include a wafer coating 70 as desired.

As will come to the mind of those skilled in the art, now having the benefit of the teachings of the present invention, various combinations and subcombinations of elements forming the packages 10 illustrated with reference to FIGS. 1-3 may be constructed. In addition, the benefits of the invention will further be appreciated with the following description of manufacturing processes.

Figure 4:
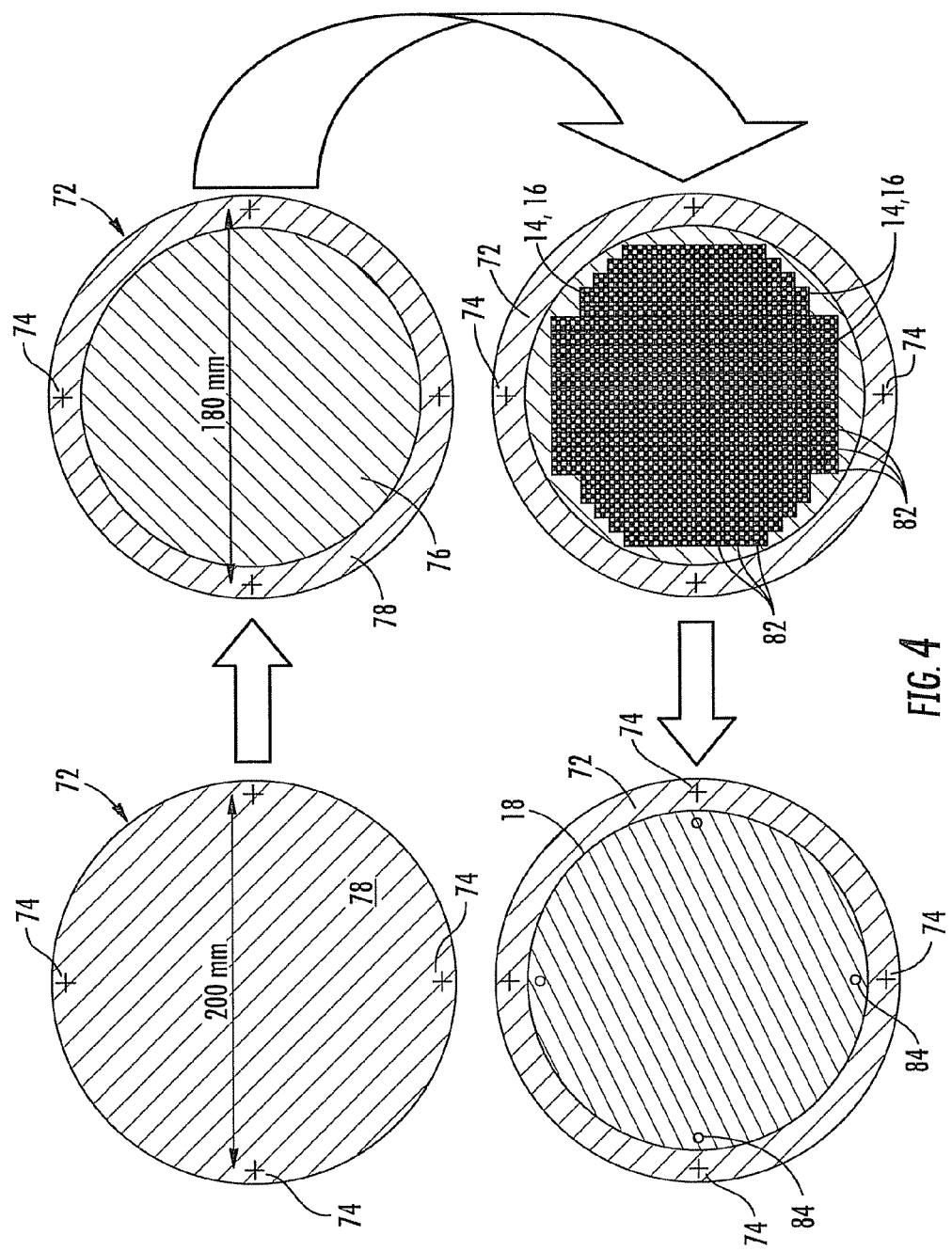
FIG. 4 is a diagrammatical illustration of one process of the invention employing a substrate for manufacturing a plurality of the wafer level packages of FIGS. 1-3.

As illustrated now with reference to FIG. 4, methods of producing the semiconductor packages 10 addressed above will generally comprise providing a carrier substrate 72 having fiducial marks 74 associated therewith for aligning the substrate and applying an adhesive layer 76 onto a top surface 78 of the carrier substrate. With continued reference to FIG. 4, preselected components 14, 16 as desired are positioned on the top surface 78 and their locations identifiable from the fiducial marks 74 even after applying the molded material 18. By way of further example for embodiments of the invention, manufacturing steps are illustrated below for producing the packages 10 above described with reference to FIGS. 1-3.

Figure 5:
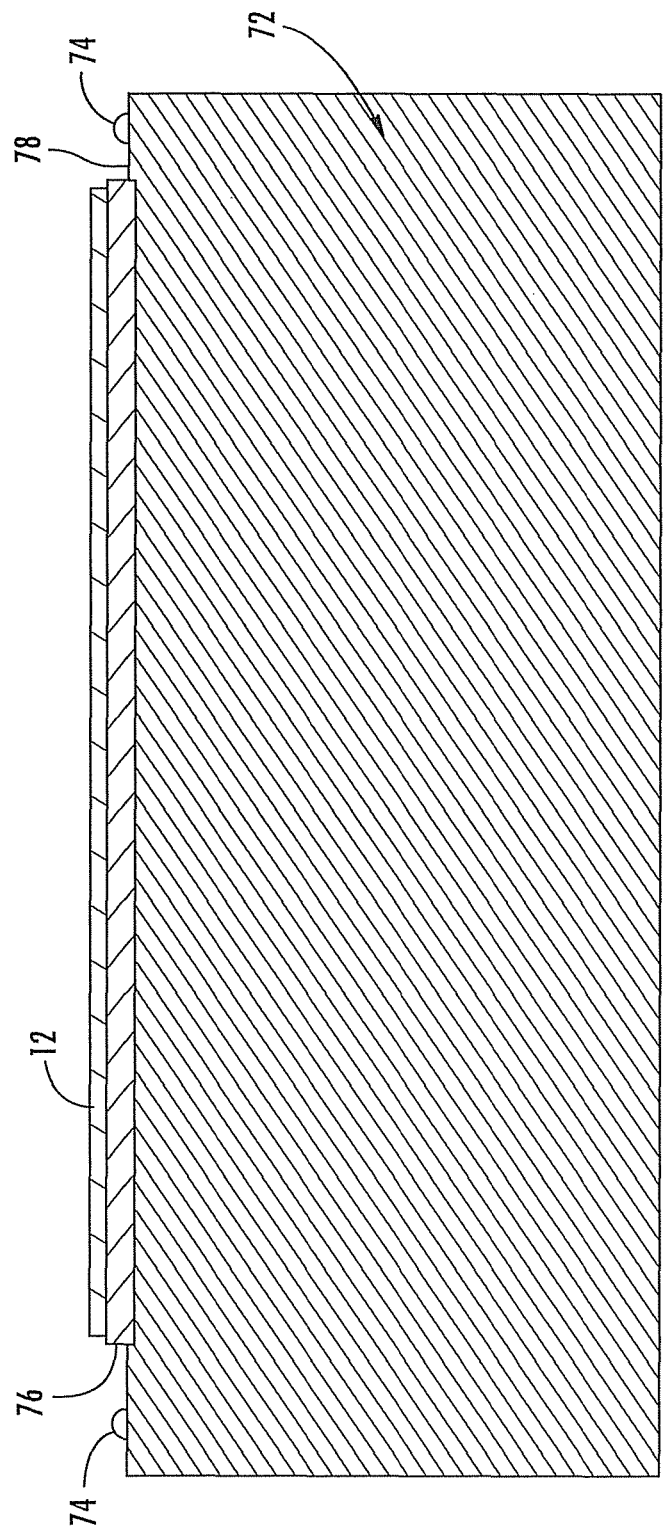
FIG. 5 is a diagrammatical elevation view of the substrate of FIG. 4 illustrating use of a temporary adhesive and an epoxy layer thereon.
Figure 6:
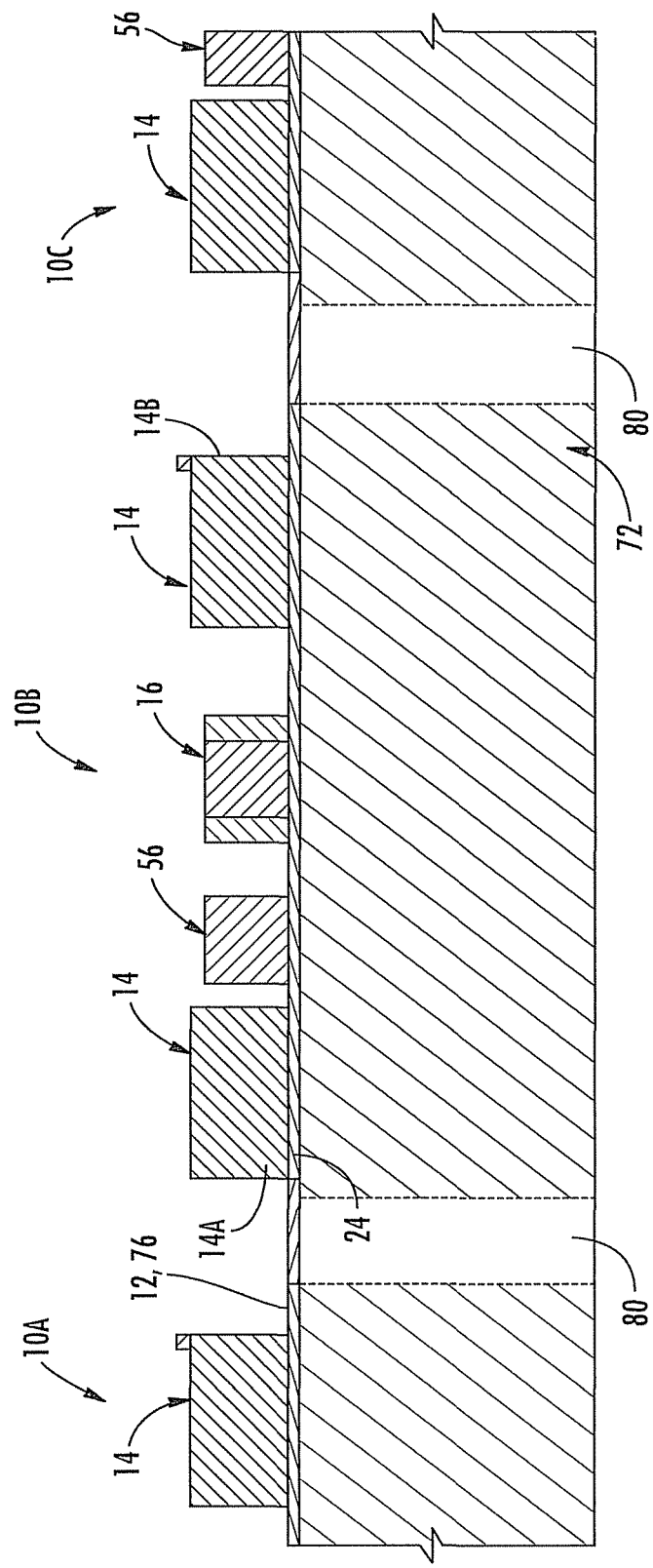
FIG. 6 is a diagrammatical illustration of multiple components placed on the substrate according to the teachings of the present invention.

With reference now to FIGS. 5 and 6, the epoxy layer 12 may optionally be applied onto the adhesive layer 76 prior to applying the components 14, 16. For the example herein described, the components 14, 16 are placed into the epoxy layer as optionally are the electrically conductive blocks 56 depending upon the package 10 being constructed. The epoxy layer is cured, thus rigidly fixing the components including the blocks in the epoxy layer. It will be understood by those of skill in the art that the continued manufacturing steps may be applied whether the optional epoxy layer 12 is employed or not. However, improved efficiency has been shown with the use of the epoxy layer.

Figure 7:
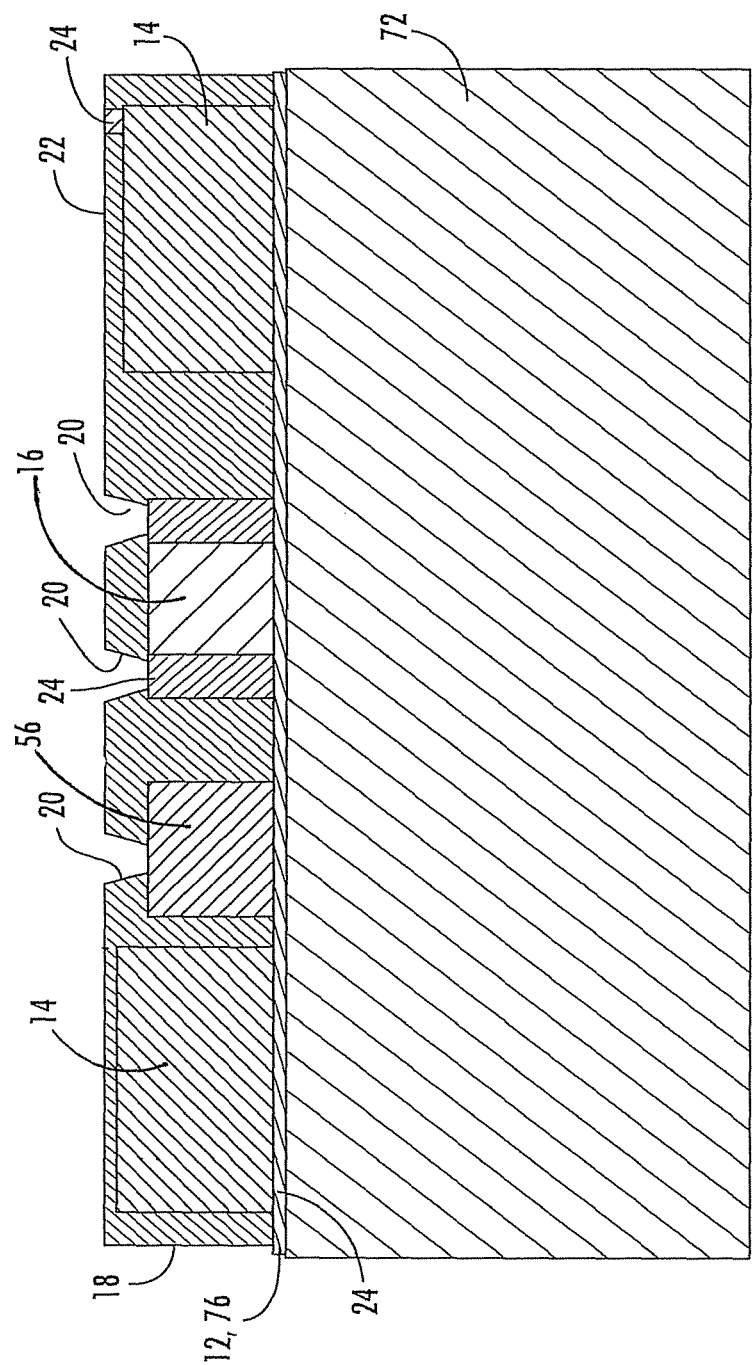
FIGS. 7-9 are partial diagrammatical cross section views of a package during various phases of manufacturing on the substrate.

With reference now to FIG. 7, all the components (herein including the block) 14, 16, 56 are embedded in the molded material 18. The surface 22 of the molded material 18 may be ground smooth as desired, and portions of the molded material removed as guided by the fiducial marks 74, earlier described with reference to FIG. 4, for producing the first vias 20 and exposing the preselected electrical contacts 24 from the component 14, 16 and for exposing the conductive block 56. The grinding may expose the contact 24 of the face up die 14B. The vias 20 will typically be laser drilled as is well known to those of skill in the art. As above described, back grinding the mold compound, the molded material 18 to expose the pillars 24 in effect renders them the same as a plated through hole in a PCB. As will be understood by those skilled in the art, multiple packages 10A, 10B, 10C, and the like will be fabricated on the substrate 12 and cut into individual packages 10 when the full package is fabricated. The packages 10 will be formed after dicing cuts 80 illustrated with reference again to FIG. 6, along streets 82, illustrated with reference again to FIG. 4, by way of example. As illustrated with reference again to FIG. 4, a process will typically include adding artwork 84 onto the exposed finished surface of the molded material 18, or other exposed top surfaces as may be appropriate, for locating the components following a stripping of the substrate and adhesive step, yet prior to a dicing into discrete packages or modules.

For ease in describing and illustrating, a single package 10 will be illustrated during its fabrication process.

Figure 8:
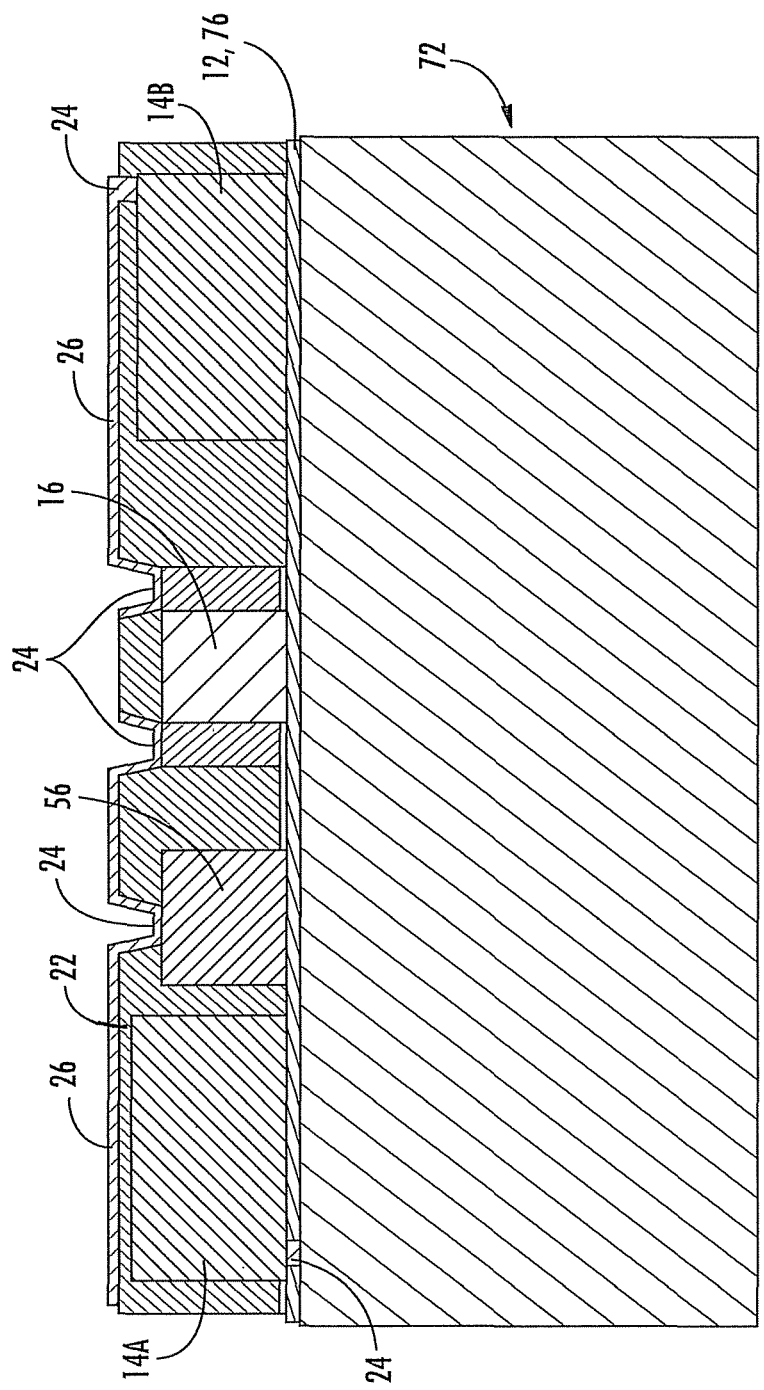

With reference now to FIG. 8, the process continues by adding the first metallization layer 26 on the surface of the molded material 18 for connecting the contacts 24 to the conductive block 56. The metalized layer forming step typically comprises forming traces connecting the die to the passive component and the conductive block.

For one embodiment of the invention, the carrier substrate 72 and the adhesive 76 may here be stripped from the epoxy layer 12 for exposing a surface of the epoxy, and a portion of the epoxy layer removed from the exposed surface for exposing preselected electrical contacts 24 from the face down die component 14A and the conductive block 56 for electrically connecting them to each other, thus providing electrical connections between the components 14A, 14B, 16.

Figure 9:
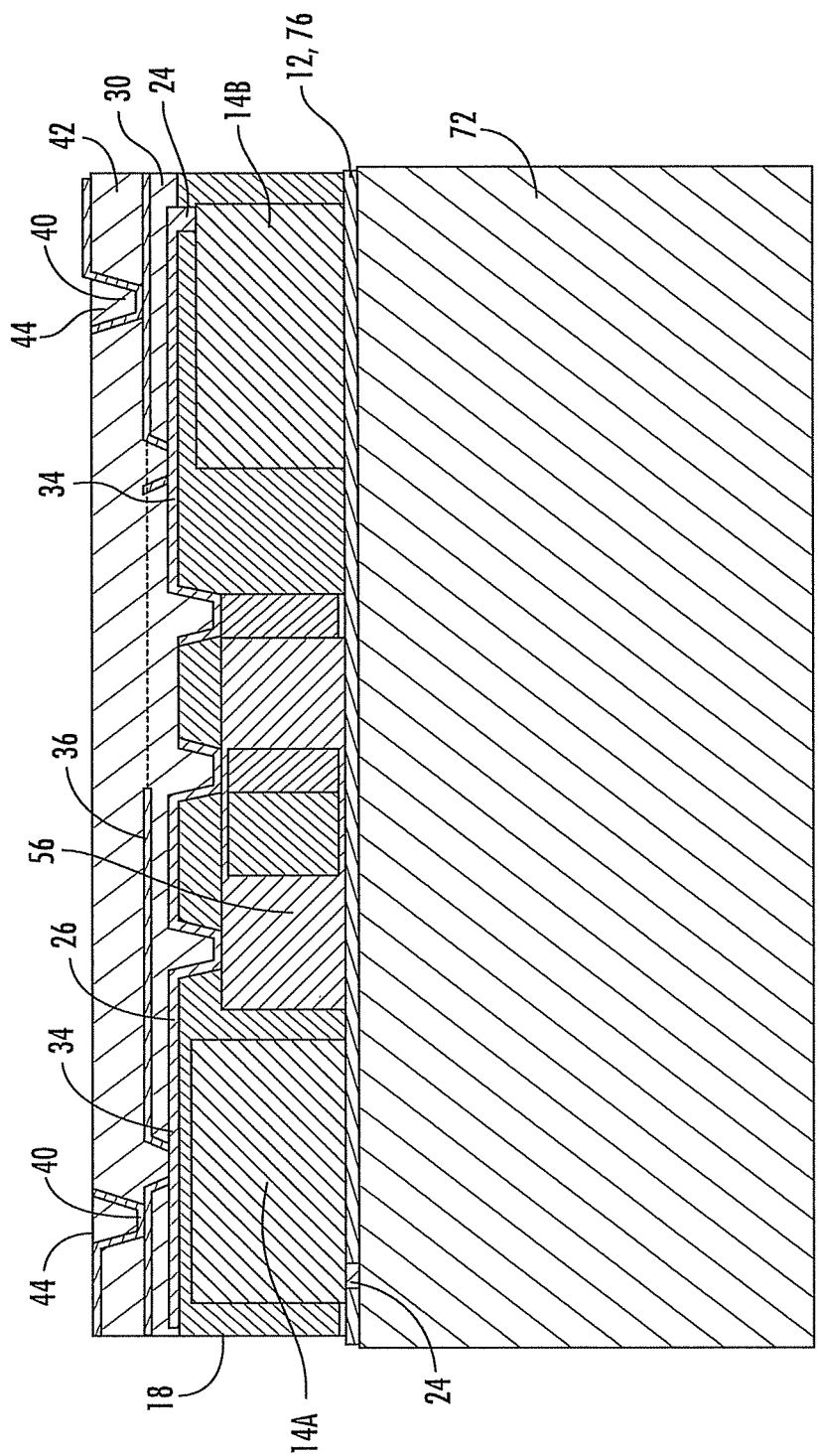

With reference now to FIG. 9, the first dielectric layer 30 is applied onto the molded material 18 for covering the first metallization layer 26 and a portion of the first dielectric layer is removed as guided by the fiducial marks for exposing the preselected locations 34 of the first metallization layer 30. The second trace or metallization layer 36 is placed onto the first dielectric layer 30 for connecting the portions of the second metallization layer 36 to portions of the first metallization layer, as desired. With continued reference to FIG. 9, the second dielectric layer 42 may now be added onto the first dielectric layer 30 for covering the second metallization layer 36. As above described, the access vias 44 may be provided electrical connection to the second metallization layer 36.

Alternatively, the metalized layer forming steps may also include forming conductive pillars.

Figure 10:
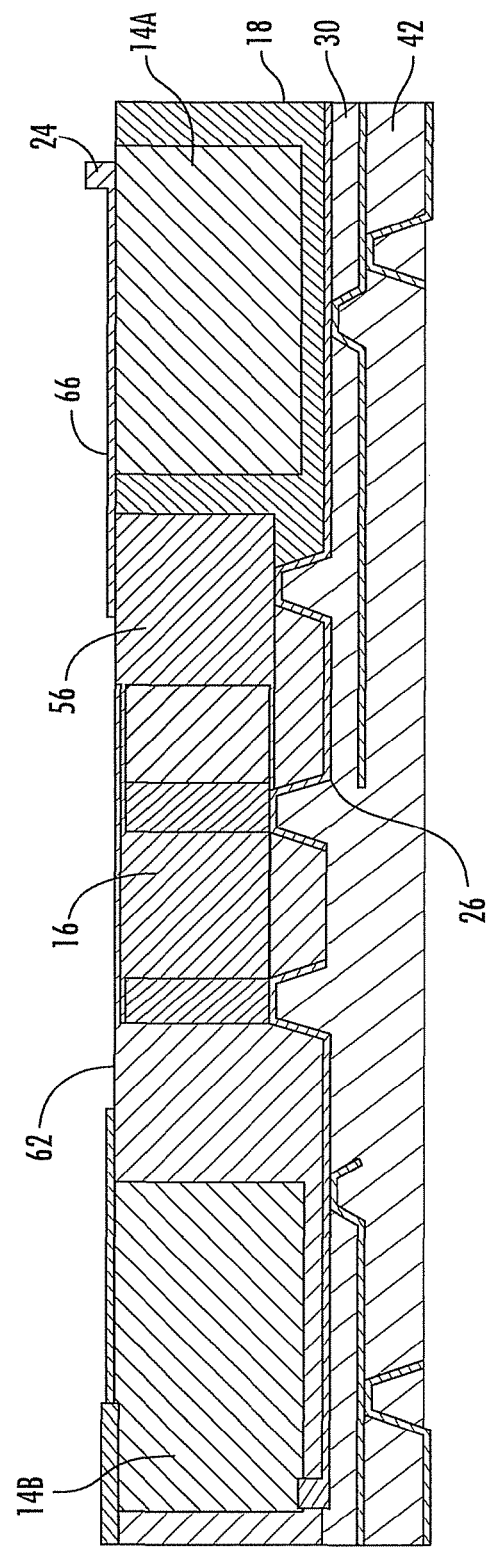
FIGS. 10-11 are partial diagrammatical cross section views of a package during various phases of manufacturing after removal from the substrate.
Figure 11:
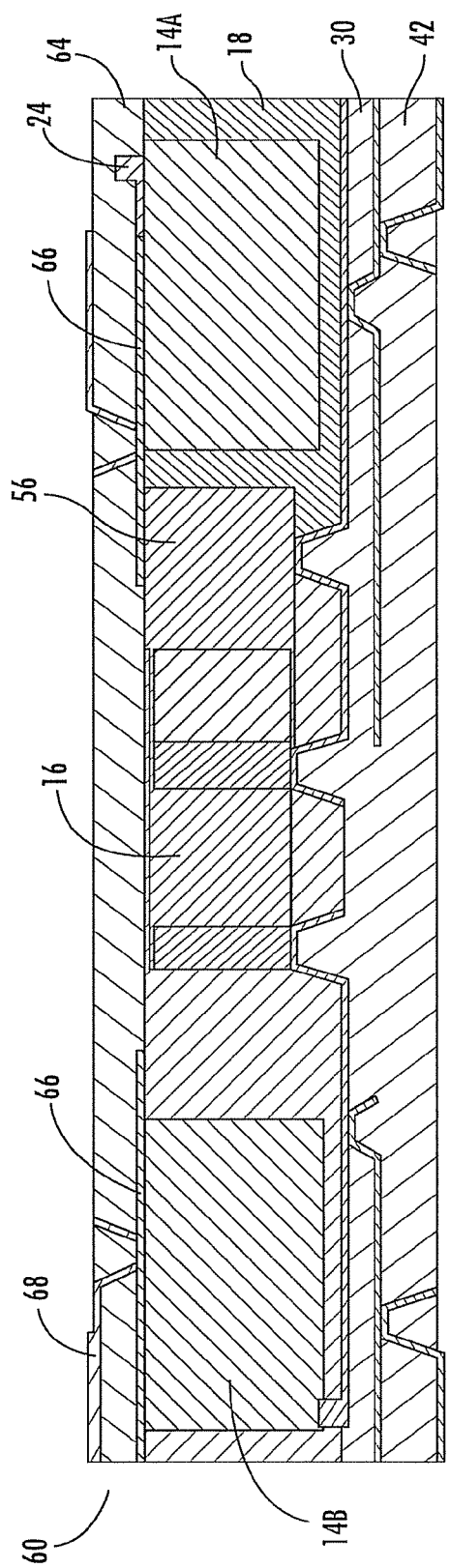

As above described, and as herein illustrated with continued reference to FIG. 9 and now to FIG. 10, the carrier substrate 72 and the adhesive 76 is stripped, and without the epoxy layer 12 used, exposing the electrical contacts 24 from the face down die component 14A and the conductive block 56 for electrically connecting them to each other, thus providing electrical connections between the components 14A, 14B, 16. The fourth metallization layer 66 is placed on the bottom surface 62 of the molded material 18 for connecting preselected electrical contacts 24 to the conductive block 56, the first metalized layer 26 electrically connecting the face up die component 14B to the passive component 16 and/or the face down die component 14A through the conductive block 56, as desired. The third dielectric layer 64 is on the bottom side 60 and covers the fourth metallization layer 66, with a fifth metallization layer 68 provided for electrically accessing the components 14A, 14B, 16 as desired. As earlier described with reference to FIG. 1, the bottom side 60 of the package 10 may further include a wafer coating 70 as desired.

Figure 12:
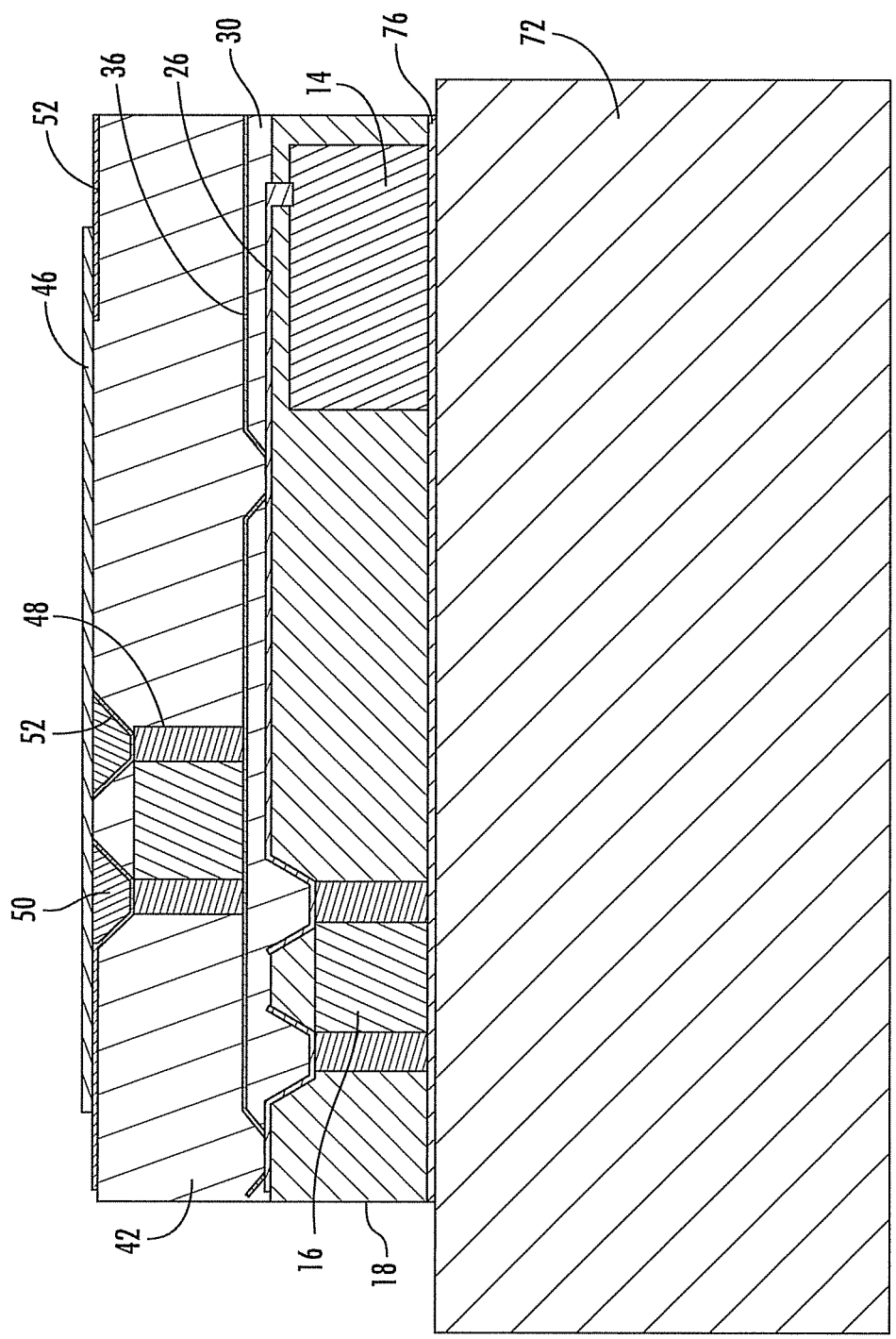
FIG. 12 is a diagrammatical cross section view of a package during manufacturing on the substrate, wherein components are stacked within the package.

As illustrated with reference again to FIG. 2 and now to FIG. 12, after forming the second metalized layer 36 on the surface of the first dielectric layer 30 for connecting the second metalized layer to the first metalized layer, a "stacked" component, herein illustrated as the second passive component 48, is placed into electrical contact with the second metalized layer.

The second dielectric layer 42 is then added to the first dielectric layer 30 for covering the second metalized layer 36 and the second passive component 48. Alternatively, the second dielectric layer 42 may be added and a void created for inserting the second passive component 48. As above described, the third vias 50 are created when portions of the second dielectric layer 42 are removed as guided by the fiducial marks for exposing the electrical contacts of the second stacked passive component 48. The third metalized layer 52 is then formed on the surface of the second dielectric layer 42 for electrical connection to the third electrical component 48. The carrier substrate 72 and the adhesive layer 76 are then stripped from the molded material 18.

It will be of interest to note that typical thickness or depth dimensions for the passive components are about 300 microns, for the die about 400 microns, and about 20 microns for the metallization layers. The carrier substrate is typically has a one millimeter thickness.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor package comprising:
an epoxy layer;
a first die fixed into the epoxy layer, wherein electrical contacts are on a first side thereof and an opposing second side thereof is fixed into the epoxy layer;
a second die fixed into the epoxy layer, wherein electrical contacts are on a first side thereof and the first side is fixed into the epoxy layer;
an electrically conductive block fixed into the epoxy layer;
a molded material encompassing the first die, the second die, and the block therein;
a first via formed within the molded material from a surface thereof for accessing the conductive block;
a metalized layer on the surface of the molded material electrically connecting the preselected electrical contacts of the first die to the conductive block; and
a second via formed within the epoxy from a surface thereof for accessing preselected electrical contacts from the second die and for accessing the conductive block; and
an electrical connection electrically connecting the preselected electrical contacts of the second die to the conductive block, thus electrically connecting the first and second dies.

2. The package according to claim 1, further comprising: a passive component, and wherein a contact pad of the passive component and an active surface of the first die are face up from the epoxy.

3. The package according to claim 2, wherein the metalized layer comprises a first trace set electrically connecting the first die to at least one of the passive component and the conductive block.

4. The package according to claim 1, further comprising:
a first dielectric layer covering the molded material and the first trace set;
at least one via penetrating the first dielectric layer for accessing preselected locations of the first trace set;
a second trace set on a surface of the first dielectric layer electrically connecting portions of the second trace set to portions of the first trace set;
a second dielectric layer covering the first dielectric layer and the second trace set; and
an access via to the second trace set for an electrical connection thereto.

5. The package according to claim 1, wherein the metalized layer includes conductive pillars.

6. A semiconductor package comprising:
an epoxy layer;
a plurality of electrical components, including a first die, a second die, and a passive component having a contact pad, fixed into the epoxy layer at preselected locations;
a molded material embedding the plurality of electrical components therein;
a plurality of vias within the molded material from a surface thereof for accessing preselected electrical contacts for at least a portion of the plurality of electrical components; and
a metalized layer on the surface of the molded material connecting the electrical contacts through the vias,
wherein the contact pad on the passive component and an active surface of the first die are upwardly facing away from the epoxy, and an active surface of the second die is downwardly facing toward the epoxy.

7. The package according to claim 6, wherein the metalized layer comprises a first trace selectively connecting the plurality of components, the package further comprising;
a first dielectric layer covering the molded material and the first trace set;
at least one second via providing access to preselected locations of the first trace set;
a second trace on a surface of the first dielectric layer connecting portions of the second trace set to portions of the first trace set;
a second dielectric layer covering the first dielectric layer and the second trace set; and
an access via to the second trace set.

8. A semiconductor package comprising:
a first die having electrical contacts on at least a first side thereof;
a second die having electrical contacts are on a first side thereof, the first and second dies carried in an opposing face up and face down orientation;
an electrically conductive block;
a molded material substantially encompassing the first and second dies and the block therein, the face down die and one side of the block being at a first surface;
a via within the molded material for accessing the conductive block;
metalized layers on surfaces of the molded material sufficient for connecting the electrical contacts to the conductive block, the metalized layers electrically connecting the first die to the second die through the conductive block.

9. The package according to claim 8, further comprising an epoxy layer securing the dies and the electrical block in a fixed position.

10. The package according to claim 8, further comprising a passive component, wherein the metalized layer comprises a first trace set connecting the first die to the passive component and the conductive block.

11. The package according to claim 10, further comprising:
a first dielectric layer covering one surface of the molded material including the first trace set;
a second trace set on a surface of the first dielectric layer connecting portions of the second trace set to portions of the first trace set through vias within the first dielectric layer;
a second dielectric layer covering the first dielectric layer and the second trace set; and
an access to the second trace set for permitting an electrical connection thereto.

* * * * *